United States Patent [19]

Hayashikura

[11] Patent Number: 5,658,804

[45] Date of Patent: Aug. 19, 1997

[54] METHOD FOR MEASURING PARASITIC COMPONENTS OF A FIELD EFFECT TRANSISTOR AND A SEMICONDUCTOR INTEGRATED CIRCUIT

[75] Inventor: Yuitsu Hayashikura, Wako, Japan

[73] Assignee: Honda Giken Kogyo Kabushiki Kaisha, Tokyo, Japan

[21] Appl. No.: 599,890

[22] Filed: Feb. 12, 1996

[30] Foreign Application Priority Data

Feb. 10, 1995 [JP] Japan .................................. 7-022990

[51] Int. Cl.⁶ .................................................. H01L 21/66
[52] U.S. Cl. .......................................................... 438/18
[58] Field of Search ............................. 437/7, 8, 54, 59; 148/DIG. 162

[56] References Cited

U.S. PATENT DOCUMENTS

| 4,961,053 | 10/1990 | Krug | 437/8 |
| 4,962,461 | 10/1990 | Meyer et al. | 437/8 |
| 5,320,975 | 6/1994 | Cederbaum et al. | 437/59 |

FOREIGN PATENT DOCUMENTS

| 1-206642 | 8/1989 | Japan . |
| 3-35542 | 2/1991 | Japan . |
| 3-232248 | 10/1991 | Japan . |
| 4-260349 | 9/1992 | Japan . |

*Primary Examiner*—Chandra Chaudhari
*Attorney, Agent, or Firm*—Lyon & Lyon LLP

[57] ABSTRACT

A field effect transistor for actual use and a pseudo field effect transistor are formed on a semiconductor substrate. The pseudo field effect transistor includes a source electrode, a drain electrode and a gate electrode, each being similar in shape to the field effect transistor for actual use except that it is formed without an active layer. Since the pseudo field effect transistor does not include any active layer, it becomes possible to measure only the transistor's parasitic components which are inherent to the shape of devices, such as electrodes, lead-out electrodes (pads) and lead-out conductor patterns. By comparing the characteristics (e.g., S parameter) of both the actual and pseudo field effect transistors, the characteristics of the intrinsic transistor region can be analyzed.

6 Claims, 4 Drawing Sheets

METHOD FOR MEASURING PARASITIC COMPONENTS OF A FIELD EFFECT TRANSISTOR AND A SEMICONDUCTOR INTEGRATED CIRCUIT

BACKGROUND OF THE INVENTION

1. Field of the Invention

The present invention relates to a method for measuring parasitic components of a field effect transistor and to a semiconductor integrated circuit which can measure the parasitic components of a field effect transistor utilizing a pseudo field effect transistor.

2. Description of the Related Art

FIG. 3 is an equivalent circuit diagram showing one example of a field effect transistor model. For estimating the high-frequency operational characteristics of a field effect transistor or for simulating the operation of an electronic circuit using field effect transistors, it is necessary to have an accurate knowledge not only of the characteristics of a transistor's intrinsic region (labeled T and enclosed with a dotted line in FIG. 3) which relate to its operation, but also of its parasitic components. The characteristics of parasitic components are the characteristics attributable to the shape of transistor. Parasitic components include elements such as gate electrode Dg, source electrode Ds and drain electrode Dd; the shape of gate pad Pg, source pad Ps and drain pad Pd; lead-out electrodes for connecting electrodes Dg, Ds and Dd to either the outside or another electrode; and the shape of conductor patterns connecting electrodes to their respective pad.

In FIG. 3, Lg represents the gate inductance of a gate lead pattern (conductor pattern for connecting gate pad Pg to gate electrode Dg). Ld represents the drain inductance of a drain lead pattern (conductor pattern for connecting drain pad Pd to drain electrode Dd). Ls represents the source inductance of a source lead pattern (conductor pattern for connecting source pad Ps to source electrode Ds). Cgd, Cgs and Cds in the intrinsic region T represent the gate-drain capacitance, gate-source capacitance and drain-source capacitance, respectively. GmVi represents a current source for supplying the current corresponding to the mutual conductance gm and the gate input voltage Vi. Ri represents the gate input resistance and gd represents the drain conductance.

Various techniques have been proposed to enable more accurate measurement and estimation of the characteristics of a field effect transistor formed on the semiconductor substrate including that of its parasitic components. For example, a technique for measuring and estimating the characteristics of a field effect transistor by forming a pseudo pattern and installing a source test electrode to this pseudo pattern is disclosed in Japanese Patent Laid-Open Publication No. HEI 4-35542.

Another method which attempts to measure the gate resistance in a Schottky field effect transistor having a multi-layered electrode comprising two or more metal gate layers is disclosed in Japanese Patent Laid-Open Publication No. HEI 4-260349. This technique involves setting the forward flowing current in a Schottky contact region to a smaller value than that of the saturating current of the channel region and the resistance generated by a measuring current in the Schottky contact region to be small enough for the gate current.

There have also been attempts to eliminate the use of electrodes to estimate the characteristics of a field effect transistor because the use of a test electrode contributes to excess parasitic capacitance. Japanese Patent Laid-Open Publication No. HEI 3-232248, for example, attempts to eliminate the problem resulting from the influence of the test electrode by separating the measuring electrode by a distance smaller than the width of a probe away from the source electrode and allowing the measuring electrode to make a short circuit with the source electrode.

However, none of these methods allow accurate measurement of the parasitic components of a field effect transistor because they cannot isolate the parasitic components from the characteristics of the intrinsic transistor region.

It is therefore desirable to be able to isolate and accurately measure the parasitic components of a transistor because the shape of the parasitic components affects the high-frequency characteristics of the transistor. By improving the shape of electrodes and any other parasitic components, the characteristics of the transistor's intrinsic region can be used more effectively. Furthermore, by comparing the total characteristics of a field effect transistor (which includes both the intrinsic and parasitic components) with its parasitic components, the characteristics of the intrinsic region may be analyzed more accurately facilitating high-frequency circuit design.

It is accordingly an object of the present invention to provide a method for accurately measuring the parasitic components of a field effect transistor.

It is a further object of the present invention to provide a semiconductor integrated circuit with a pseudo field effect transistor for measuring the parasitic components of the field effect transistor.

SUMMARY OF THE INVENTION

These and other objects of the present invention are achieved by providing on a semiconductor substrate a field effect transistor in combination with a pseudo field effect transistor. This pseudo field effect transistor is formed without an active layer (inactive layer) and has the same shape as the actual field effect transistor. By measuring the impedance of the pseudo field effect transistor, the parasitic components of the field effect transistor may be accurately determined.

Since the pseudo field effect transistor, which is formed without an active layer, does not act as a functioning transistor (due to the inactive layer), measuring its impedance makes it possible to accurately know the parasitic components inherent to the shape of devices such as the source, drain and gate electrodes, pads serving as lead-out electrodes or for connecting them with other circuit elements, and conductor patterns located between the electrodes and pads.

Furthermore, the characteristics of the intrinsic transistor region can be accurately determined by comparing and analyzing the individually measured characteristics (e.g., S parameter) of the field effect transistor and pseudo field effect transistor formed on the inactive layer region.

Accurate determination of the characteristics of the intrinsic transistor region and the characteristics of the parasitic components allows the estimation of high-frequency characteristics and the simulation of circuit with a high degree of accuracy.

BRIEF DESCRIPTION OF THE DRAWINGS

The present invention will hereinafter be discussed in detail with reference to the accompanying drawings, in which.

DETAILED DESCRIPTION OF THE INVENTION

Figure 1:
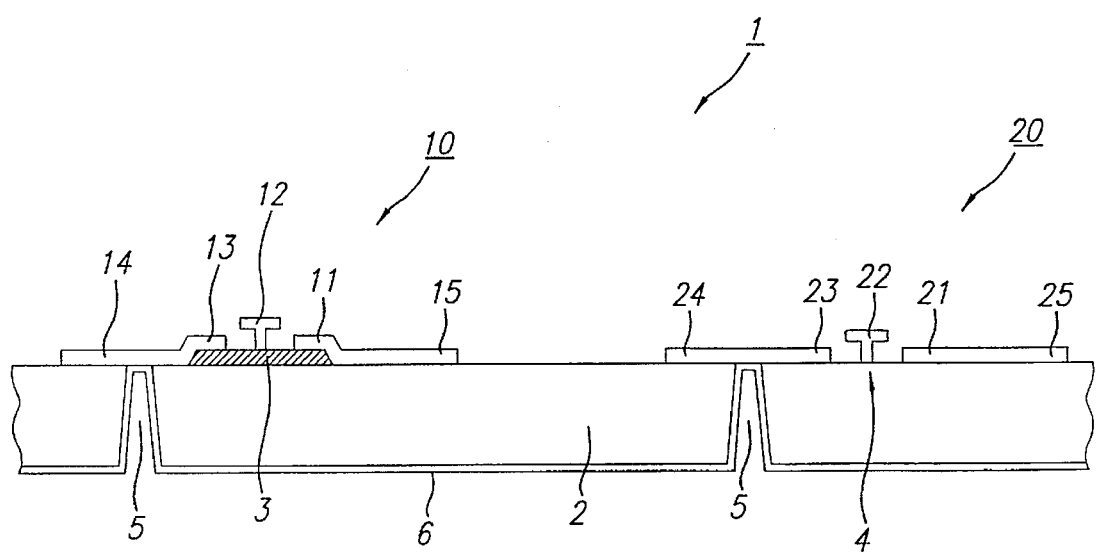
FIG. 1 is a schematic sectional view showing the main structure of a semiconductor integrated circuit according to the present invention.

Referring to FIG. 1, a semiconductor integrated circuit 1 according to the present invention includes a field effect transistor 10 for actual use and a pseudo field effect transistor 20 having electrodes similar in shape to those of the actual field effect transistor 10.

The field effect transistor 10 to be actually used includes drain electrode 11, gate electrode 12 and source electrode 13 on an active layer (epitaxial layer) 3 formed on semiconductor substrate 2. Similarly, pseudo field effect transistor 20 includes drain electrode 21, gate electrode 22 and source electrode 23 on an inactive layer region 4 with no active layer (epitaxial layer). Note that electrodes 11, 12 and 13 of field effect transistor 10 and electrodes 21, 22 and 23 of pseudo field effect transistor 20 are formed in the same shape.

Source pads 14 and 24 are electrically connected via holes 5, 5' to a plated layer 6 formed on the back side of the semiconductor substrate 2.

Figure 2:
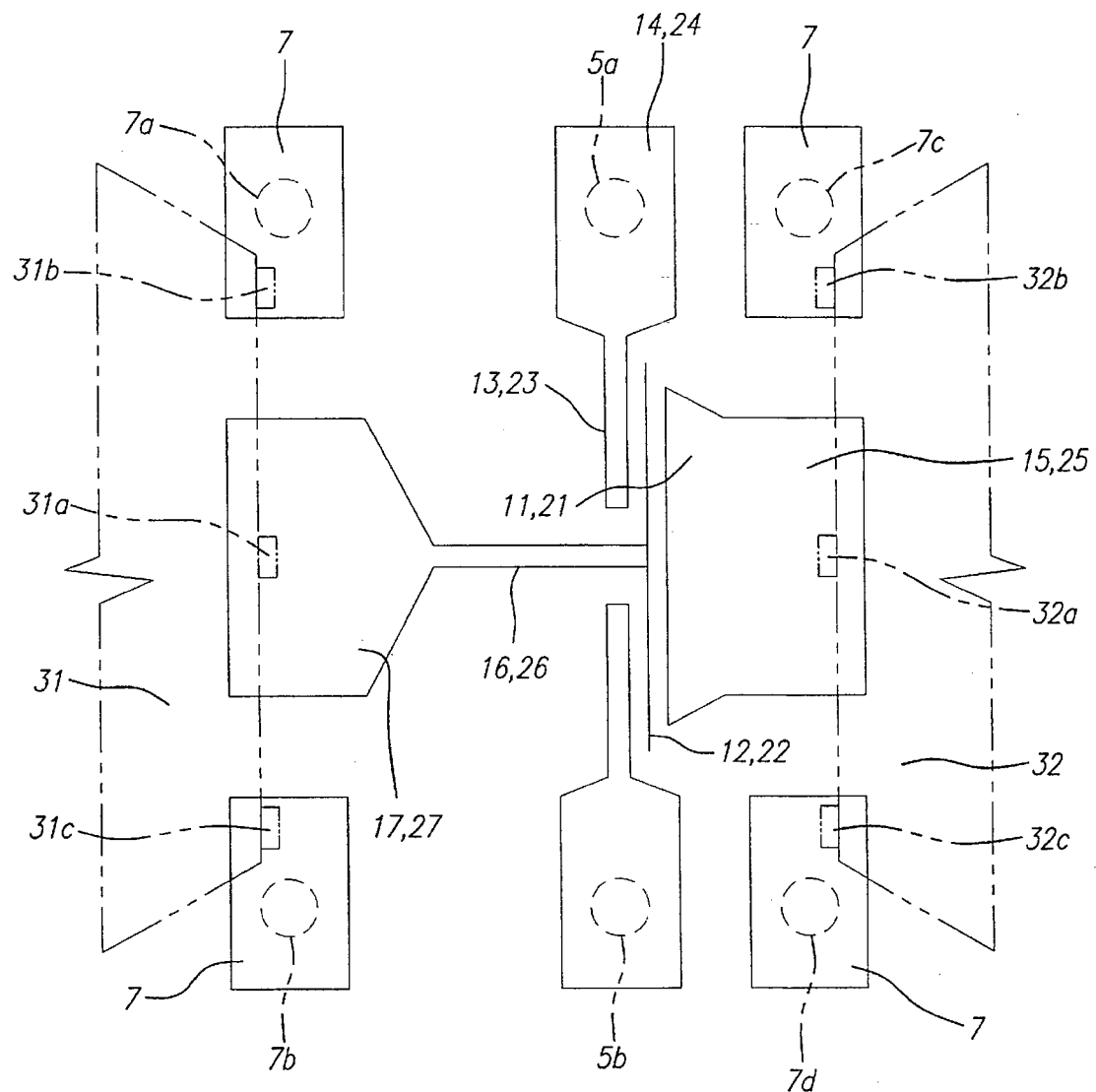
FIG. 2 is a schematic plan view showing the electrode structure of an actual field effect transistor and a pseudo field effect transistor.
Figure 3:
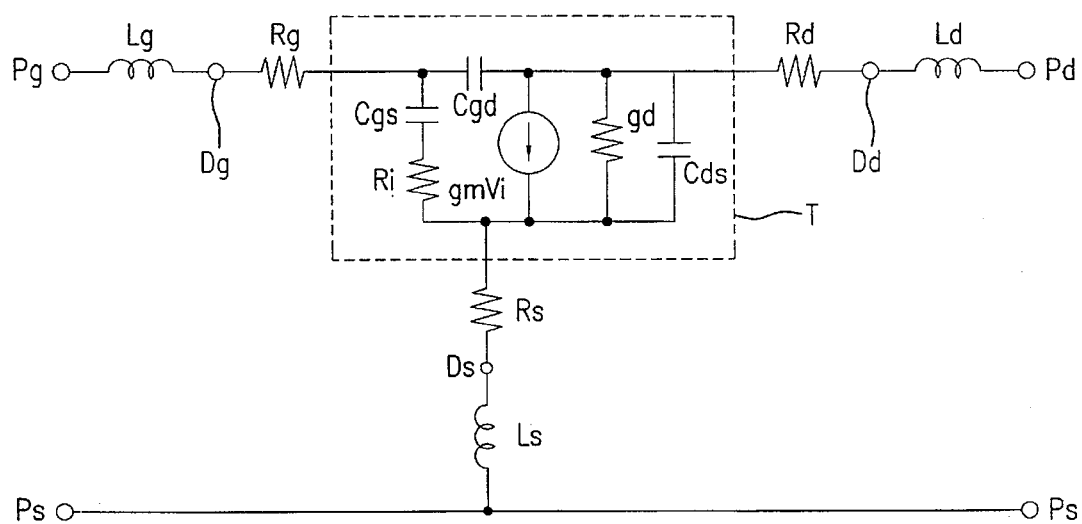
FIG. 3 is an equivalent-circuit diagram showing a conventional field effect transistor model.

FIG. 2 is a schematic plan view showing the electrode structure of an actual field effect transistor and a pseudo field effect transistor. Reference numerals 15 and 25 denote drain pads. Gate electrodes 12 and 22 are connected via gate lead-out conductor patterns 16 and 26 to gate pads 17 and 27. Reference numerals 5a and 5b represent holes. Designated by reference numeral 7 are measuring or ground pads. There are a total of four measuring pads, each of which is electrically connected through its own hole 7a, 7b, 7c or 7d to a plated layer 6 formed on the back side of the semiconductor substrate 2 (not shown).

Reference numerals 31 and 32 represent probe heads for measuring transistor characteristics. At the center of the tip of each probe head 31 and 32 there are signal probes 31a and 32a. Ground probes 31b & 31c and 32b & 32c are provided at both ends of the respective tips.

By utilizing two probe heads 31 and 32 against gate pads 17 and 27, drain pads 15 and 25 and their own measuring pads 7, the characteristics (e.g., S parameter) of both the actual field effect transistor 10 and the pseudo field effect transistor 20 may be measured. By measuring the characteristics of pseudo field effect transistor 20, the characteristics (e.g., S parameter) of the parasitic components can be accurately determined. Because pseudo field effect transistor 20 and field effect transistor 10 differ only with respect to not having active layer 3, it becomes possible to accurately determine the parasitic components inherent to the device shape by measuring the impedance of pseudo field effect transistor 20.

Figure 4:
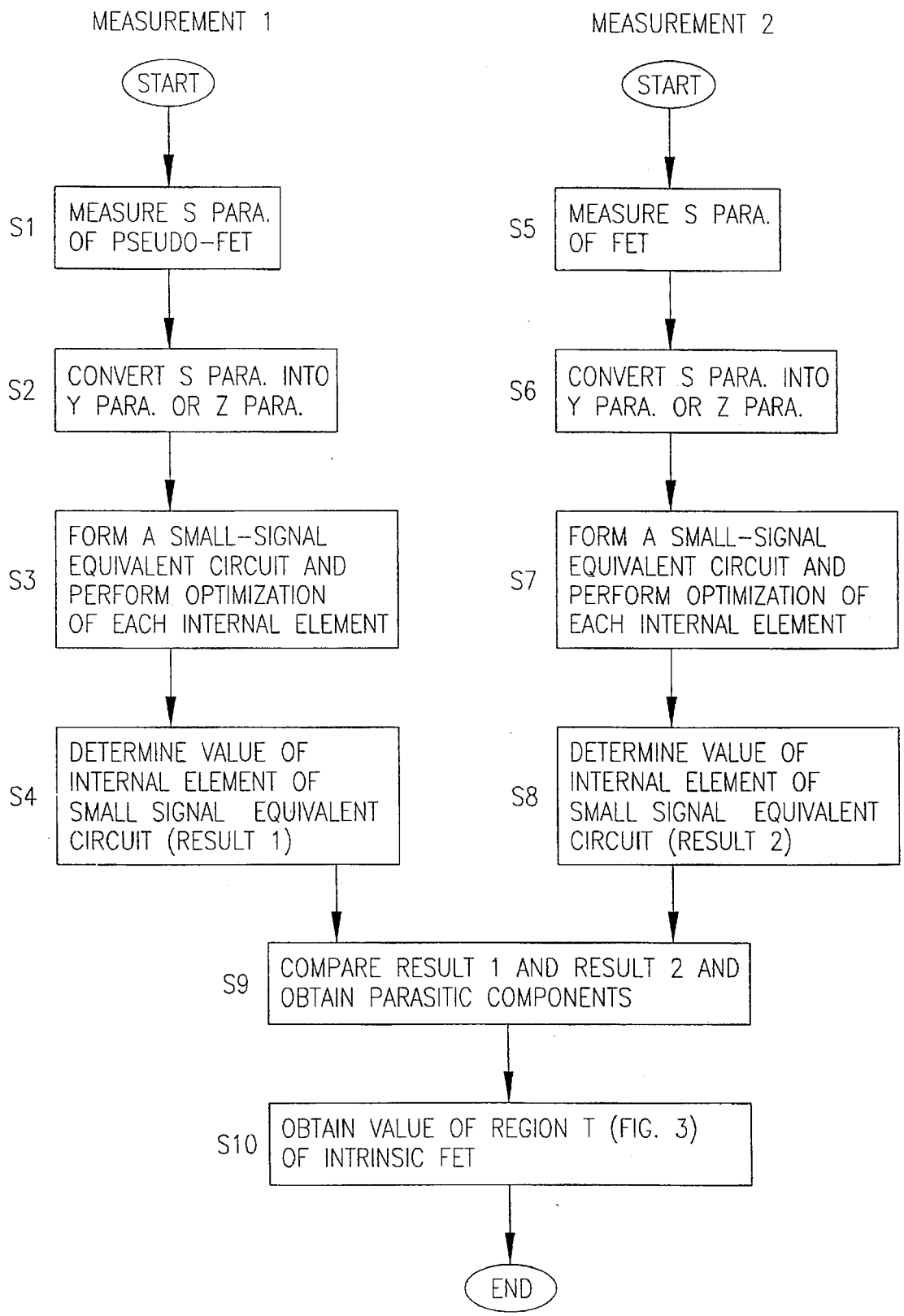
FIG. 4 is a flow diagram illustrating the principal steps in computing the parasitic components.

Referring now to FIG. 4, the steps for calculating the parasitic components is shown to include steps S1 through S10. First, the S parameter of the pseudo field effect transistor 20 is measured in step S1 and the S parameter of the actual field effect transistor 10 is measured in step S5. Measurement of the respective S parameters allows calculation of the Y and Z parameter (steps S2 and S6) and small-signal equivalent circuit (steps S3 and S7). Once the values of all the internal components for the small signal equivalent circuit are determined (steps S4 and S8), the results are compared (step S9) and the characteristics of the transistor's intrinsic region T can be calculated (step S10). By individually measuring and comparing the characteristics of the actual field effect transistor 10 and the pseudo field effect transistor 20 formed on the inactive layer region (both devices having the same shape), the characteristics of the intrinsic transistor region can be accurately determined. Accurate determination of the characteristics of the intrinsic transistor region and the parasitic components allows the estimation of high-frequency characteristics and simulation of circuit operation with a high degree of accuracy.

Although this invention has been described and illustrated with a certain degree of particularity, it is understood that the present disclosure has been made only be way of example, and that numerous changes in the combination and arrangement of parts can be resorted to by those skilled in the art without departing from the spirit and scope of the invention, as hereinafter claimed.

What is claimed is:

1. A method for measuring parasitic components of a field effect transistor formed on a semiconductor substrate, the method comprising the steps of:

forming on said semiconductor substrate a field effect transistor for actual use;

forming on said semiconductor substrate a pseudo field effect transistor;

measuring the impedance of said pseudo field effect transistor;

measuring the parasitic components of said field effect transistor based on said measured impedance.

2. A method for measuring parasitic components of a field effect transistor formed on a semiconductor substrate, the method comprising the steps of:

forming on said semiconductor substrate a field effect transistor for actual use;

forming on said semiconductor substrate a pseudo field effect transistor;

measuring the characteristics of said field effect transistor for actual use and said pseudo field effect transistor;

comparing and analyzing the characteristics of said field effect transistor for actual use and said pseudo field effect transistor.

3. A method for measuring parasitic components of a field effect transistor formed on a semiconductor substrate as in claims 1 or 2, wherein the method for forming said field effect transistor further comprises the steps of:

forming on said semiconductor substrate an active layer;

forming on said active layer a field effect transistor which includes at least a source electrode, a drain electrode and a gate electrode.

4. A method for measuring parasitic components of a field effect transistor formed on a semiconductor substrate as in claims 1 or 2, wherein the method for forming said pseudo field effect transistor further comprises the steps of:

forming on said semiconductor substrate an inactive layer;

forming on said inactive layer a pseudo field effect transistor which includes at least a source electrode, a drain electrode and a gate electrode all of which are similar in shape to said field effect transistor.

5. A method for measuring parasitic components of a field effect transistor according to claim 2 wherein said characteristics of said field effect transistor for actual use and said pseudo field effect transistor are individually measured.

6. A method for measuring parasitic components of a field effect transistor according to claim 2, wherein said characteristics includes the S parameter of said field effect transistor.

* * * * *